(12) United States Patent
Sejima et al.

(10) Patent No.: US 10,330,735 B2
(45) Date of Patent: Jun. 25, 2019

(54) STATE ESTIMATION DEVICE AND STATE ESTIMATION METHOD

(71) Applicant: GS Yuasa International Ltd., Kyoto-shi (JP)

(72) Inventors: Kenichi Sejima, Kyoto (JP); Takeyuki Shiraishi, Kyoto (JP)

(73) Assignee: GS YUASA INTERNATIONAL LTD., Kyoto-Shi, Kyoto (JP)

( * ) Notice: Subject to any disclaimer, the term of this patent is extended or adjusted under 35 U.S.C. 154(b) by 265 days.

(21) Appl. No.: 15/179,718

(22) Filed: Jun. 10, 2016

(65) Prior Publication Data

US 2016/0370431 A1 Dec. 22, 2016

(30) Foreign Application Priority Data

Jun. 17, 2015 (JP) .................................. 2015-122032
May 2, 2016 (JP) .................................. 2016-092347

(51) Int. Cl.
*G01R 31/36* (2019.01)
*G01R 31/3842* (2019.01)
(Continued)

(52) U.S. Cl.
CPC ....... *G01R 31/3842* (2019.01); *G01R 31/367* (2019.01); *G01R 31/3648* (2013.01);
(Continued)

(58) Field of Classification Search
USPC ......................................................... 702/63
See application file for complete search history.

(56) References Cited

U.S. PATENT DOCUMENTS

2004/0207367 A1 10/2004 Taniguchi et al.
2008/0255783 A1 10/2008 Tamai
(Continued)

FOREIGN PATENT DOCUMENTS

GB    2 448 412 A    10/2008
JP    2001-231179 A    8/2001
(Continued)

OTHER PUBLICATIONS

Extended European Search Report dated Nov. 11, 2016.

*Primary Examiner* — Paul D Lee
(74) *Attorney, Agent, or Firm* — McGinn IP Law Group, LLC

(57) ABSTRACT

A state estimation device includes: a current integration unit configured to integrate a current that flows through the energy storage device; and a first estimation unit configured to estimate a full-charge capacity of the energy storage device. The energy storage device has a correlation characteristic of correlation between a residual capacity C and an open voltage V, the correlation characteristic including a constant region in which a time change in the correlation characteristic is relatively smaller than an other region. The first estimation unit performs: calculation of a residual capacity $C_p$ of the energy storage device at a measuring point P based on an open voltage $V_p$ of the energy storage device at the measuring point P included in the constant region, and on the correlation characteristic; and estimation of a full-charge capacity $C_o$ of the energy storage device based on the residual capacity $C_p$ at the measuring point P that has been calculated, and on an accumulated charge-discharge amount X of the energy storage device from a full-charge state to the measuring point P, the full-charge state satisfying a full charge condition.

20 Claims, 14 Drawing Sheets

(51) Int. Cl.
  *G01R 31/367* (2019.01)
  *G01R 31/392* (2019.01)
  *G01R 31/3828* (2019.01)
  *G01R 31/387* (2019.01)

(52) U.S. Cl.
  CPC ....... *G01R 31/3828* (2019.01); *G01R 31/392* (2019.01); *G01R 31/387* (2019.01)

(56) References Cited

U.S. PATENT DOCUMENTS

| | | |
|---|---|---|
| 2011/0012604 A1 | 1/2011 | Tsujiko et al. |
| 2011/0307033 A1 | 12/2011 | Michaels et al. |
| 2012/0091969 A1 | 4/2012 | Izumi |
| 2012/0176092 A1 | 7/2012 | Fujii et al. |
| 2013/0030739 A1 | 1/2013 | Takahashi et al. |
| 2013/0076366 A1 | 3/2013 | Arizono et al. |
| 2013/0110428 A1 | 5/2013 | Sun et al. |
| 2013/0124029 A1 | 5/2013 | Izumi |
| 2013/0311119 A1 | 11/2013 | Tamezane |
| 2015/0260795 A1 | 9/2015 | Vinit et al. |
| 2016/0049821 A1 | 2/2016 | Aridome |

FOREIGN PATENT DOCUMENTS

| | | |
|---|---|---|
| JP | 2001-332310 A | 11/2001 |
| JP | 2003-068369 A | 3/2003 |
| JP | 2004-333472 A | 11/2004 |
| JP | 2005-269760 A | 9/2005 |
| JP | 2008-261669 A | 10/2008 |
| JP | 2010-266221 A | 11/2010 |
| JP | 2011-007564 A | 1/2011 |
| JP | 2011-043460 A | 3/2011 |
| JP | 2011-075443 A | 4/2011 |
| JP | 2011-257213 A | 12/2011 |
| JP | 2012-145403 A | 8/2012 |
| JP | 2012-239357 A | 12/2012 |
| JP | 2013-101072 A | 5/2013 |
| JP | 2013-238403 A | 11/2013 |
| JP | 2013-250071 A | 12/2013 |
| JP | 2014-007079 A | 1/2014 |
| JP | 2014-169937 A | 9/2014 |
| JP | 2014-185896 A | 10/2014 |
| JP | 2015-121444 A | 7/2015 |
| JP | 2015-184146 A | 10/2015 |
| WO | WO 2009/122991 A1 | 10/2009 |
| WO | WO 2011/125213 A1 | 10/2011 |
| WO | WO 2012/010955 A2 | 1/2012 |
| WO | WO 2012/105492 A1 | 8/2012 |
| WO | WO 2015/092521 A1 | 6/2015 |

FIG. 7

| TEMPERATURE T | REDUCED AMOUNT W OF FULL-CHARGE CAPACITY Ct |
|---|---|
| T1 | W(T1, n) |
| T2 | W(T2, n) |
| T3 | W(T3, n) |
| T4 | W(T4, n) |
| T5 | W(T5, n) |
| T6 | W(T6, n) |
| T7 | W(T7, n) |

STATE ESTIMATION DEVICE AND STATE ESTIMATION METHOD

CROSS-REFERENCE TO RELATED APPLICATIONS

This application claims the benefit of Japanese patent applications No. 2015-122032, filed on Jun. 17, 2015, and No. 2016-092347, filed on May 2, 2016, which are incorporated by reference.

FIELD

The present invention relates to a technique for estimating a full-charge capacity of an energy storage device.

BACKGROUND

Conventionally, there has been known a method of estimating a full-charge capacity of a secondary battery based on a difference of SOC between two points and a current integration value between the two points (see JP 2003-68369 A). This estimation method assumes that there is a region in which an OCV-SOC table does not change due to capacity degradation.

SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

An application of the above-mentioned method may be difficult, for example, for an iron phosphate based lithium ion secondary battery, in which an OCV-SOC table changes due to capacity degradation with time (from the initial state). There is another method of estimating a full-charge capacity of a secondary battery using a record of environmental temperature. However, estimation accuracy may gradually decrease due to an accumulation of errors in temperature measurement.

An object of the present invention is to provide a state estimation device capable of keeping an estimation accuracy for estimating a full-charge capacity regardless of time passage from the initial state.

An aspect of the present invention disclosed herein provides a state estimation device that estimates a state of an energy storage device, the state estimation device including: a current integration unit configured to integrate a current that flows through the energy storage device; and a first estimation unit configured to estimate a full-charge capacity of the energy storage device, wherein the energy storage device has a correlation characteristic of correlation between a residual capacity C and an open voltage V, the correlation characteristic including a constant region in which a time change in the correlation characteristic is relatively smaller than an other region, and the first estimation unit performs: calculation of a residual capacity Cp of the energy storage device at a measuring point P based on an open voltage (open circuit voltage) Vp of the energy storage device at the measuring point P included in the constant region, and on the correlation characteristic; and estimation of a full-charge capacity Co of the energy storage device based on the residual capacity Cp at the measuring point P that has been calculated, and on an accumulated charge-discharge amount X of the energy storage device from a full-charge state to the measuring point P, the full-charge state satisfying a full charge condition.

Another aspect of the present invention disclosed herein provides a state estimation device that estimates a state of an energy storage device, the state estimation device including: a current integration unit configured to integrate a current that flows through the energy storage device; and a first estimation unit configured to estimate a full-charge capacity of the energy storage device, wherein the first estimation unit performs: calculation of a residual capacity Cp of the energy storage device at an arbitrary measuring point P based on an open voltage Vp of the energy storage device at the measuring point P, and on a correlation characteristic between a residual capacity C and the open voltage Vp; confirmation that the residual capacity Cp that has been calculated is equal to or lower than a predetermined value; and estimation of a full-charge capacity Co of the energy storage device based on the residual capacity Cp at the measuring point P, and on an accumulated charge-discharge amount X of the energy storage device from a full-charge state to the measuring point P, the full-charge state satisfying a full charge condition.

BRIEF DESCRIPTION OF DRAWINGS

The foregoing and other features of the present invention will become apparent from the following description and drawings of an illustrative embodiment of the invention in which:

FIG. 7 is a table showing correlation between an environmental temperature and a reduced amount W of the secondary battery.

DESCRIPTION OF EMBODIMENTS (Outline of Embodiment)

Figure 1:
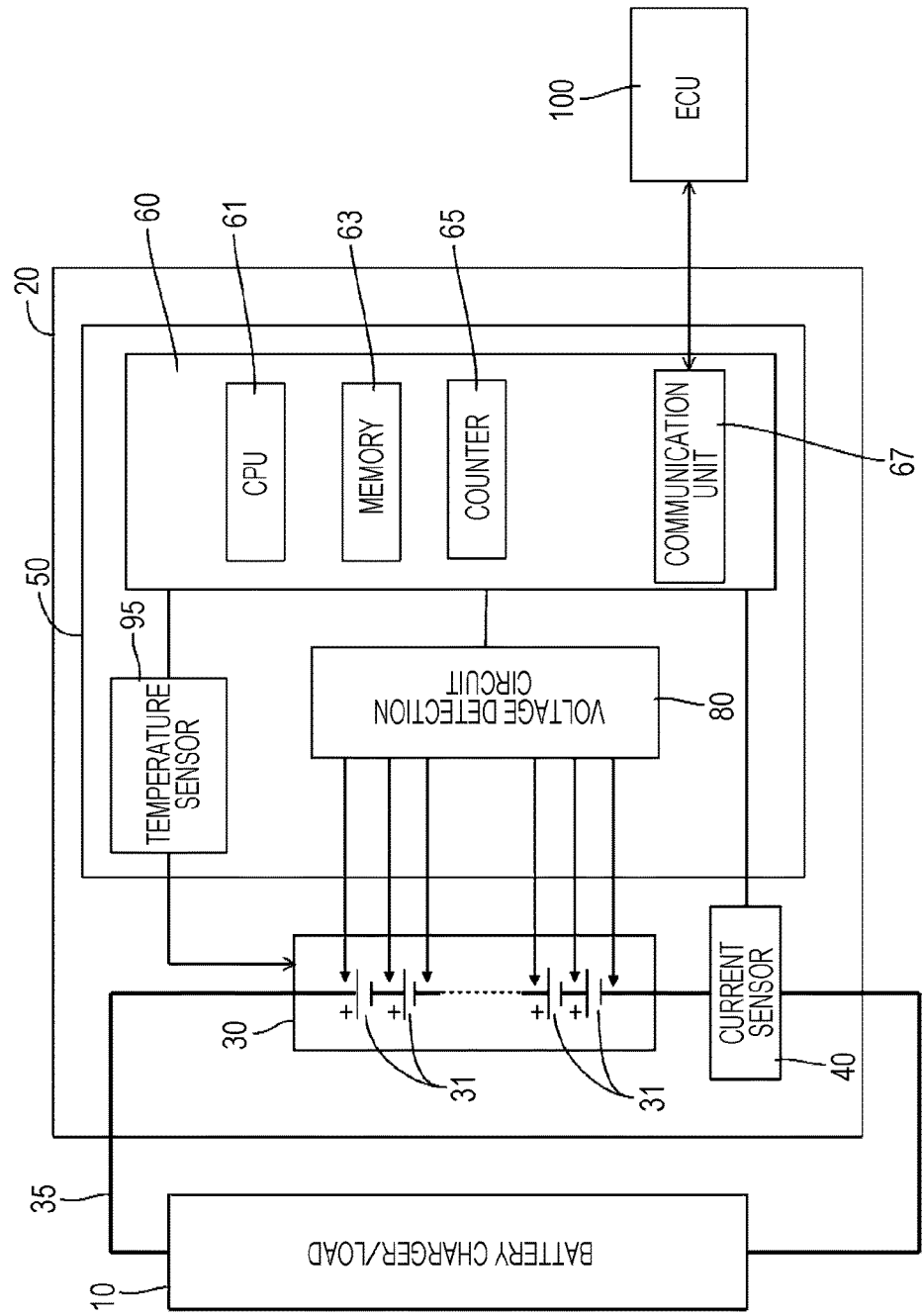
FIG. 1 is a schematic diagram illustrating a configuration of a battery pack according to Embodiment 1.
Figure 2:
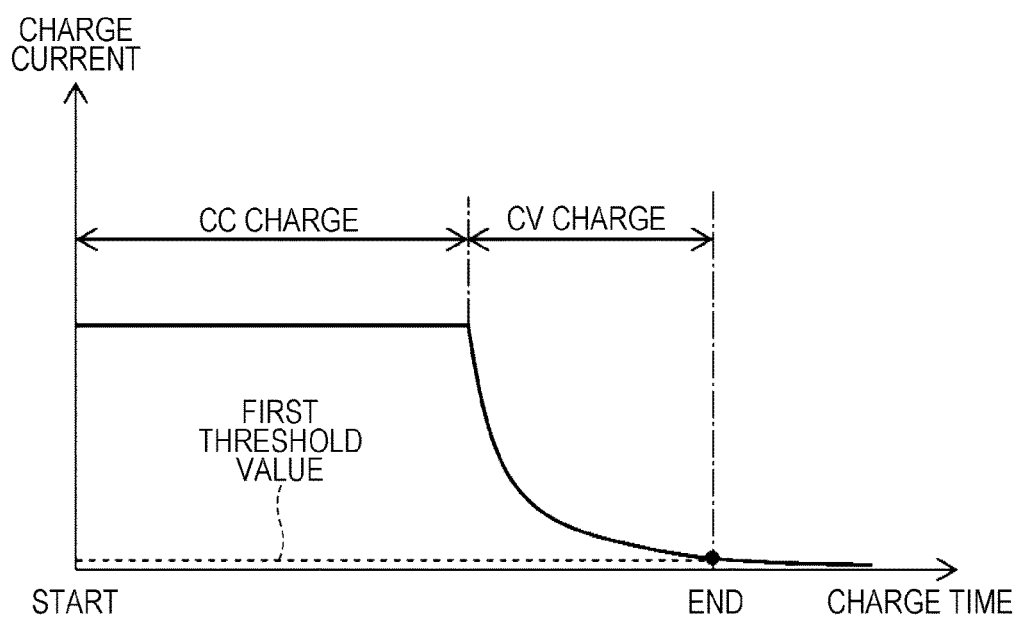
FIG. 2 is a chart showing charge characteristics of a secondary battery.

First, an outline of a state estimation device disclosed according to one embodiment will be described. The state estimation device includes: a current integration unit configured to integrate a current that flows through the energy storage device; and a first estimation unit configured to estimate a full-charge capacity of the energy storage device, wherein the energy storage device has a correlation characteristic of correlation between a residual capacity C and an open voltage V, the correlation characteristic including a constant region in which a time change in the correlation characteristic is relatively smaller than an other region, and the first estimation unit performs: calculation of a residual capacity Cp of the energy storage device at a measuring point P based on an open voltage Vp of the energy storage device at the measuring point P included in the constant region, and on the correlation characteristic; and estimation of a full-charge capacity Co of the energy storage device based on the residual capacity Cp at the measuring point P that has been calculated, and on an accumulated charge-discharge amount X of the energy storage device from a full-charge state to the measuring point P, the full-charge state satisfying a full charge condition. According to the above state estimation device, an estimation accuracy for estimating a full-charge capacity can be kept regardless of time passage from the initial state.

The state estimation device may be provided with the following configurations.

The first estimation unit may perform: calculation of a minimum value Cpmin and a maximum value Cpmax of the residual capacity Cp of the energy storage device at the measuring point P based on the open voltage Vp of the energy storage device at the measuring point P and on the correlation characteristic; and calculation of a minimum value Comin and a maximum value Comax of the full-charge capacity Co of the energy storage device respectively by adding the accumulated charge-discharge amount X to the minimum value Cpmin and the maximum value Cpmax of the residual capacity Cp. According to this configuration, it is possible to calculate a possible range (minimum value Comin to maximum value Comax) of the full-charge capacity Co of the energy storage device.

The constant region includes a low-change region in which a ratio of change of the open voltage V with respect to the residual capacity C is relatively smaller than another region. In the low-change region, it is difficult to specify the residual capacity Cp accurately based on the open voltage Vp, as the ratio of change of the open voltage V with respect to the residual capacity C is small. When the constant region includes the low-change region, it is preferable to calculate the range of the full-charge capacity Co, as errors are smaller.

When the open voltage Vp is measured at two different measuring points P at which ratios of change of the open voltage V with respect to the residual capacity C are different, the first estimation unit may perform a process of calculating the minimum value Comin and the maximum value Comax of the full-charge capacity Co of the energy storage device by selecting one of the measuring points P whose ratio of change of the open voltage V is greater than the other. The possible range of the full-charge capacity Co may be restricted, that is, narrowed to a small range as compared to a case in which one of the measuring points P whose ratio of change of the open voltage V is smaller than the other.

The first estimation unit may calculate the minimum value Comin and the maximum value Comax of the full-charge capacity Co of the energy storage device including at least one of a detection error of the full-charge state and an error of the accumulated charge-discharge amount X. This allows accurate calculation of the possible range (minimum value Comin to maximum value Comax) of the full-charge capacity.

The state estimation device may include: a second estimation unit configured to estimate a full-charge capacity Ct of the energy storage device based on environmental temperature information; and a comparator unit configured to compare the full-charge capacity Ct of the energy storage device estimated based on the environmental temperature information with the minimum value Comin and the maximum value Comax of the full-charge capacity Co calculated using the correlation characteristic, wherein if the full-charge capacity Ct based on the environmental temperature information is outside a range from the minimum value Comin to the maximum value Comax, the full-charge capacity Ct based on the environmental temperature information is reset to a value within the range from the minimum value Comin to the maximum value Comax, the value being closer to the full-charge capacity Ct relative to a medium value of the range from the minimum value Comin to the maximum value Comax. With this configuration, it is possible to reset the estimated value of the full-charge capacity based on the environmental temperature information to a value closer to the true value.

The state estimation device may include: a determination unit configured to determine life of the energy storage device by comparing the full-charge capacity Ct of the energy storage device estimated by the second estimation unit with a predetermined value. With this configuration, it is possible to determine the life of the energy storage device.

<Embodiment 1>

Embodiment 1 will be described with reference to FIG. 1 through FIG. 11.

1. Configuration of Battery Pack 20

FIG. 1 is a diagram illustrating a configuration of a battery pack 20 according to this embodiment. The battery pack 20 is mounted on an electric vehicle or a hybrid electric vehicle, for example, and is used to supply power to a power source driven by electrical energy.

As illustrated in FIG. 1, the battery pack 20 includes an assembled battery 30, a current sensor 40, and a battery manager (hereinafter, BM) 50 that manages the assembled battery 30. The assembled battery 30 is configured by a plurality of secondary batteries 31 that are connected in series.

The secondary batteries 31 and the current sensor 40 are connected in series via a line 35, and connected to a battery charger 10 mounted on an electric vehicle, or to a load 10 such as a power source provided within the electric vehicle or the like.

The battery charger 10 serves a function of charging the assembled battery 30. A charging method by the battery charger 10 is a CC/CV (constant current/constant voltage) method, in which when a secondary battery 14 reaches a changeover voltage, the charging is switched from constant current charge to constant voltage charge. Further, the battery charger 10 detects a charge current using a built-in current sensor (not shown). If the charge current falls under a first threshold value, the battery charger 10 determines that the battery is fully charged and stops charging (see FIG. 2). That is, in this embodiment, the battery charger 10 determines a full-charge state under a condition that the charge current falls under the first threshold value. Alternatively, other than the method based on the charge current, it is possible to employ a method of detecting the full-charge state by determining whether or not a total voltage of the assembled battery 30 reaches a specific value.

The current sensor 40 serves a function of detecting a current that flows through the secondary batteries 31. The current sensor 40 is configured to measure a current value of the secondary batteries 31 at a constant cycle, and to transmit data of the measured current value that has been measured to a controller 60.

The BM 50 includes the controller 60, a voltage detection circuit 80, and a temperature sensor 95. Here, each of the secondary batteries 31 is one example of the "energy storage device", the BM 50 is one example of the "state estimation device", and the controller 60 is one example of the "current integration unit", the "first estimation unit", the "second estimation unit", and the "comparator unit".

The voltage detection circuit 80 is connected to both sides of each of the secondary batteries 31 via detection lines, and serves a function of measuring a voltage of each of the secondary batteries 31 in response to an instruction from the controller 60. The temperature sensor 95 serves a function of measuring an environmental temperature T [° C.] of the secondary batteries 31 either in a contacting manner or in a contactless manner. Here, the voltage detection circuit 80 is one example of the "voltage detection unit". While FIG. 1 shows the configuration in which the temperature sensor 95 is included in the BM 50, the temperature sensor 95 may be provided outside the BM 50 (near each of the secondary batteries 31, for example). In that case, a detection signal (temperature information) from the temperature sensor 95 may be input to the controller 60 via an input unit or a signal conversion unit (e.g., A/D converter) not shown but disposed in the BM 50. Further, while the configuration in which the voltage detection circuit 80 is included in the BM 50 is disclosed, the voltage detection circuit 80 may also be provided outside the BM 50. In that case, too, a detection signal (voltage information) detected from each of the secondary batteries may be input to the controller 60 via an input unit or a signal conversion unit not shown but disposed in the BM 50.

The controller 60 includes a central processing unit (hereinafter, CPU) 61, a memory 63, a counter 65, and a communication unit 67. The controller 60 serves a function of calculating a full-charge capacity Ct of each of the secondary batteries 31 and a possible range (from Comin to Comax) of a full-charge capacity Co of each of the secondary batteries 31. The controller 60 is one example of the "first estimation unit", the "second estimation unit", and the "comparator unit".

Figure 4:
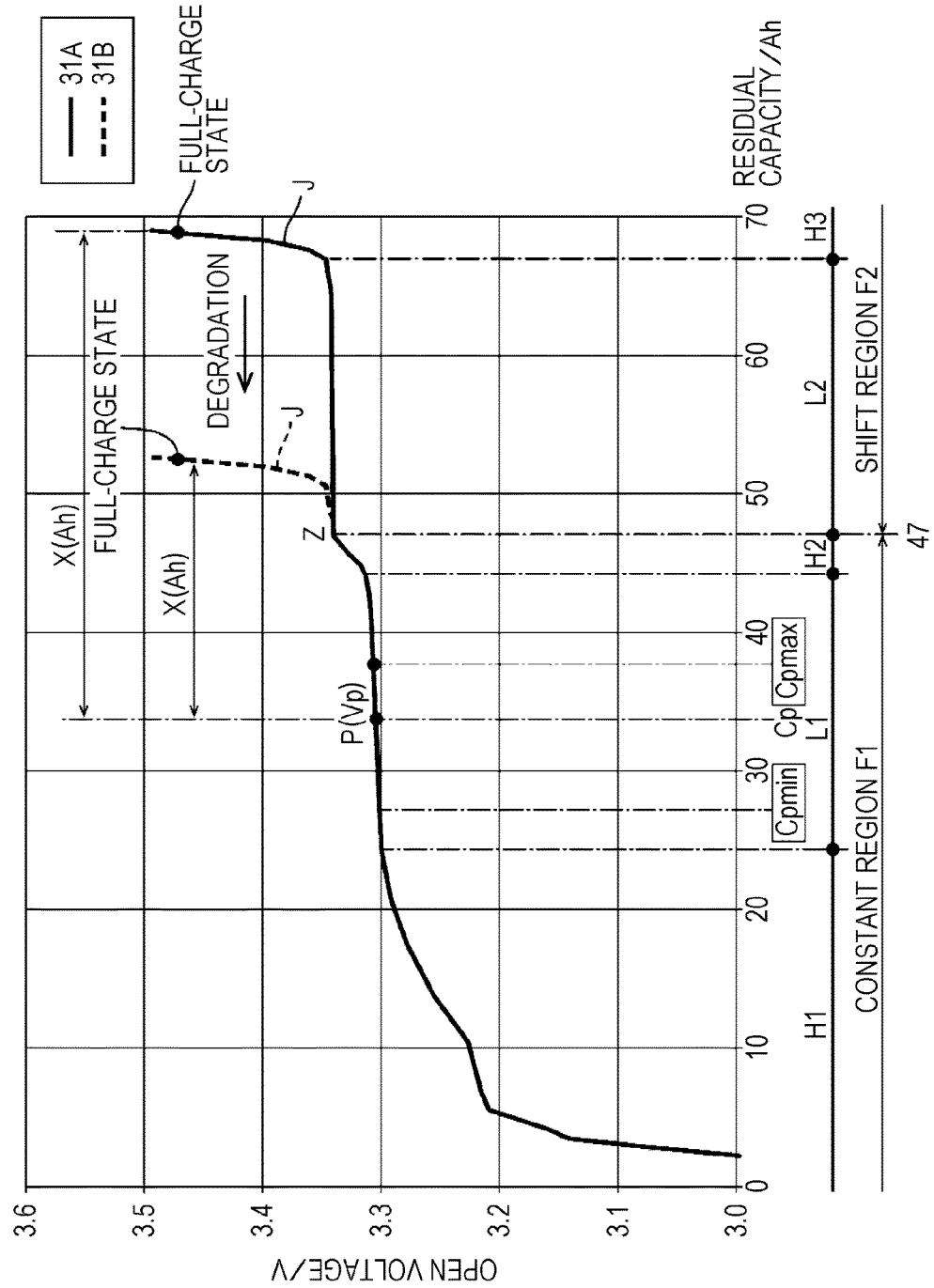
FIG. 4 is a chart showing C-V correlation characteristics of the secondary battery.

The memory 63 stores a calculation program for executing a process of calculating the possible range (from Comin to Comax) of the full-charge capacity Co of each of the secondary batteries 31, and data required to execute the program, such as data of C-V correlation characteristics shown in FIG. 4, for example. In addition, the memory 63 also stores a program for calculating the full-charge capacity Ct of each of the secondary batteries 31 based on a record of environmental temperature, a program for executing a process of resetting the full-charge capacity Ct, and data required to execute the programs, such data of a reduced amount W of the full-charge capacity Co as shown in FIG. 7, for example.

The counter T serves a function of counting elapsed time n that will be later described. The communication unit 67 is connected to an ECU (Electronic Control Unit) 100 mounted on a vehicle so as to be able to communicate with the ECU 100, and serves a function of communicating with the ECU 100 mounted on a vehicle. Here, the battery pack 20 is also provided with an operating unit for accepting an input from a user (not shown), and an indicator indicating a state and the like of the secondary batteries 31 (not shown).

2. SOC-V Correlation Characteristic and C-V Correlation Characteristic of Secondary Battery 31

In the following description, an iron-phosphate-based lithium ion battery using lithium iron phosphate (LiFePO4) as a positive active material and graphite as a negative active material is taken as one example of the secondary batteries 31.

(2-1) SOC-V Correlation Characteristics

Figure 3:
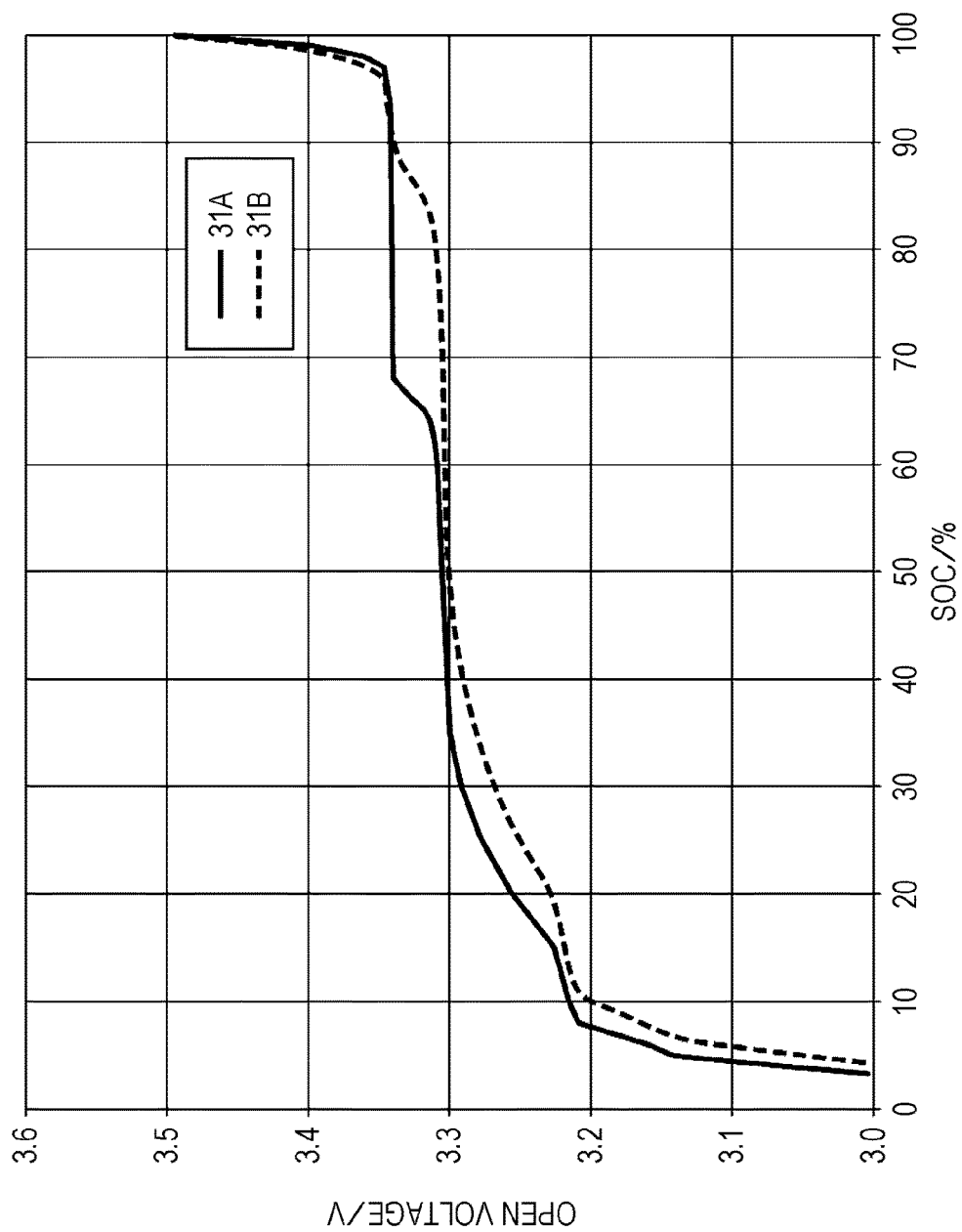
FIG. 3 is a chart showing SOC-V correlation characteristics of the secondary battery.

FIG. 3 shows SOC-V correlation characteristics of the secondary batteries 31, expressing SOC [%] by a horizontal axis, and an open circuit voltage (open voltage) V [V] by a vertical axis. In FIG. 3, a solid line indicates an SOC-V correlation characteristic of a secondary battery 31A with an initial capacity (initial state), and a dashed line indicates an SOC-V correlation characteristic of a secondary battery 31B after capacity degradation due to a predetermined time passage from the initial state. As shown in FIG. 3, the SOC-V correlation characteristic of the secondary battery 31B after capacity degradation due to the predetermined time passage from the initial state include only few region that matches the SOC-V correlation characteristic of the secondary battery 31A with an initial capacity. That is, the secondary battery 31 has a characteristic such that its SOC-V correlation characteristic changes with time.

(2-2) C-V correlation characteristic

FIG. 4 shows C-V correlation characteristics of the secondary batteries 31, expressing the residual capacity C [Ah] by a horizontal axis, and the open voltage V [V] by a vertical axis. In FIG. 4, a solid line indicates a C-V correlation characteristic of the secondary battery 31A with an initial capacity (initial state), and a dashed line indicates a C-V correlation characteristic of the secondary battery 31B after capacity degradation due to a predetermined time passage from the initial state.

As shown in FIG. 4, the secondary battery 31 has a characteristic such that along with capacity degradation due to time passage, a rising edge J of the open voltage V near the full-charge capacity shifts to a side on which the residual capacity is lower (left side in FIG. 4). In this example, as shown in FIG. 4, the rising edge J shifts in a range from 47 [Ah], which is a minimum shifting point (left side in FIG. 4) toward a side on which the residual capacity is higher. A region in which the residual capacity C is equal to or higher than 47 [Ah] corresponds to a "shift region F2" in which the rising edge J shifts along with capacity degradation due to time passage.

On the other hand, in a region in which the residual capacity C is lower than 47 [Ah] the C-V correlation characteristic is substantially the same regardless of the occurrence of capacity degradation with time. This region corresponds to a "constant region F1" in which the C-V correlation hardly changes with time.

Figure 10:
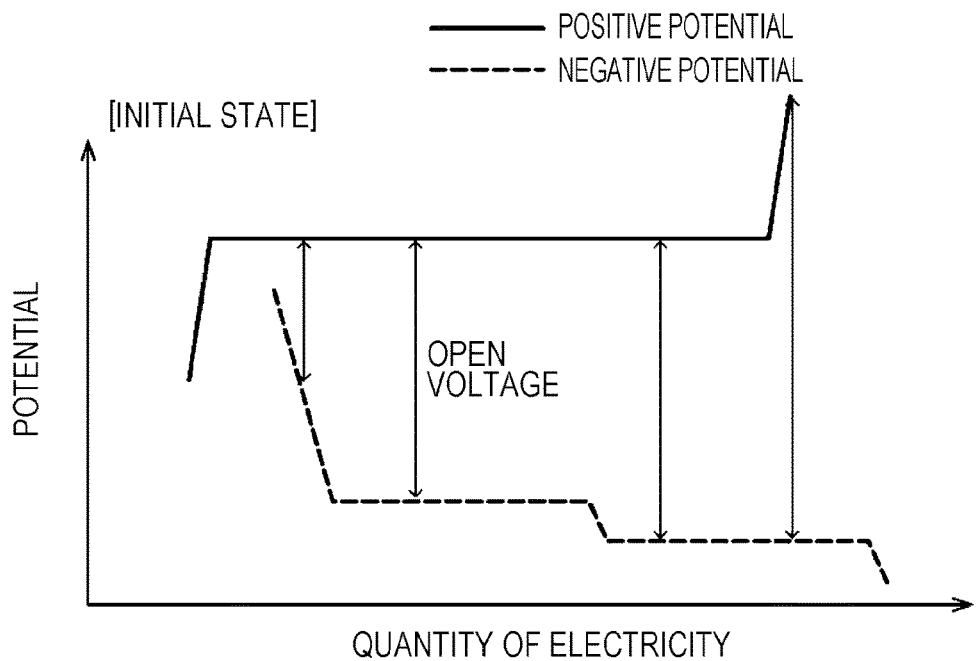
FIG. 10 is a chart showing correlation between a positive potential and a quantity of electricity, and correlation between a negative potential and a quantity of electricity.
Figure 11:
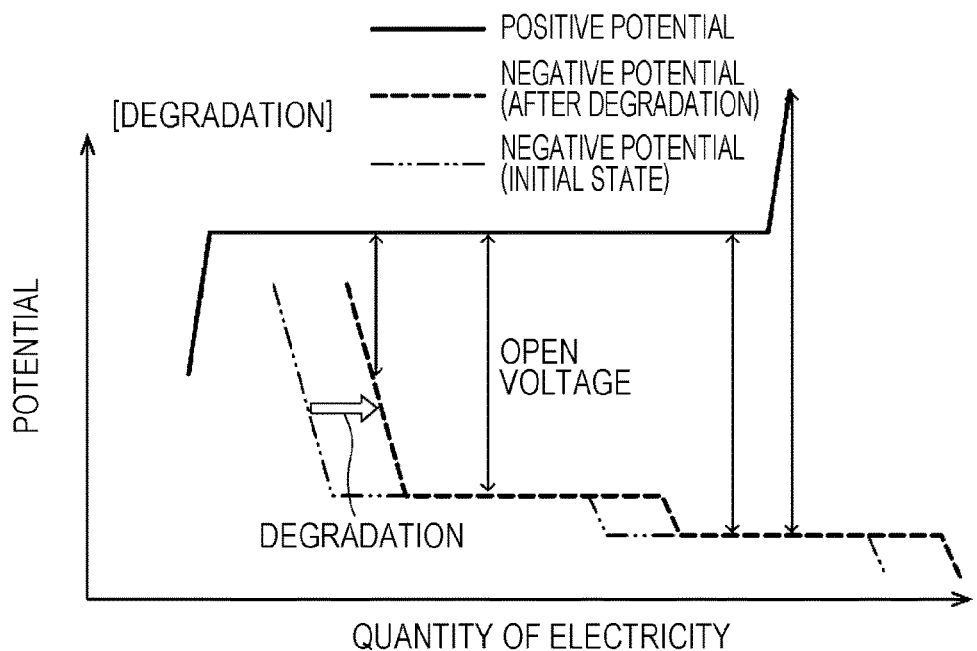
FIG. 11 is a chart showing correlation between a positive potential and a quantity of electricity, and correlation between a negative potential and a quantity of electricity.

A reason why the C-V correlation characteristic of the secondary battery 31 includes the "constant region F1" in which the C-V correlation hardly changes with time shall be stated below. The voltage of the secondary battery 31 may be expressed by a difference between a positive potential and a negative potential, as shown in FIG. 10. With the lithium ion secondary battery 31, as shown in FIG. 11, capacity degradation from the initial state tends to occur due to relative displacement between the positive potential and the negative potential when charge and discharge are repeated. As shown in FIG. 10 and FIG. 11, the positive potential and the negative potential include a flat region in which a change in the open voltage [V] with respect to capacity [Ah] is substantially zero. Therefore, even when there is relative displacement between the positive potential and the negative potential, there is a region in which there is no difference between the positive potential and the negative potential, that is, the C-V correlation hardly changes with time.

The constant region F1 includes a first low-change region L1 in which a ratio of change of the open voltage V with respect to the residual capacity C is relatively small, and a first high-change region H1 and a second high-change region H2 in which the ratio of change of the open voltage V with respect to the residual capacity C is relatively large.

In the first low-change region L1, the residual capacity C is in a range of 22-43 [Ah], and the open voltage V is in a range from 3.30 [V] to 3.31 [V]. The first high-change region H1 is positioned on a side on which the residual capacity is lower (left side in FIG. 4) with respect to the low-change region L1, and within a range in which the open voltage V is equal to or lower than 3.30 [V]. The second high-change region H2 is positioned on a side on which the residual capacity is higher (right side in FIG. 4) with respect to the low-change region L1, and within a range in which the open voltage V is from 3.31 [V] to 3.34 [V].

The shift region F2 includes a second low-change region L2 in which the ratio of change of the open voltage V with respect to the residual capacity C is relatively small, and a third high-change region H3 in which the ratio of change of the open voltage V with respect to the residual capacity C is relatively large. In the second low-change region L2, the residual capacity C is in a range of 47-67 [Ah], and the open voltage V is generally constant at 3.34 [V]. In the third high-change region H3, the residual capacity C is equal to or higher than 67 [Ah], and the open voltage V is higher than 3.34 [V].

3. Method of Calculating Possible Range of Full-Charge Capacity Co based on C-V Correlation Characteristic In this embodiment, the possible range (from Comin to Comax) of the full-charge capacity Co is calculated using the C-V correlation characteristic, through the following steps (a) to (c).

(a) Measuring the open voltage Vp at an arbitrary measuring point P included in the constant region F1.

(b) Calculating the minimum value Cpmin and the maximum value Cpmax of the residual capacity Cp of the secondary battery 31 at the measuring point P, based on the open voltage Vp at the measuring point P and the C-V correlation characteristic.

(c) Calculating the minimum value Comin and the maximum value Comax of the full-charge capacity Co of the secondary battery 31, respectively, by adding the accumulated charge-discharge amount X of the secondary battery 31 from the full-charge state to the measuring point P to the minimum value Cpmin and the maximum value Cpmax of the residual capacity Cp.

Figure 5:
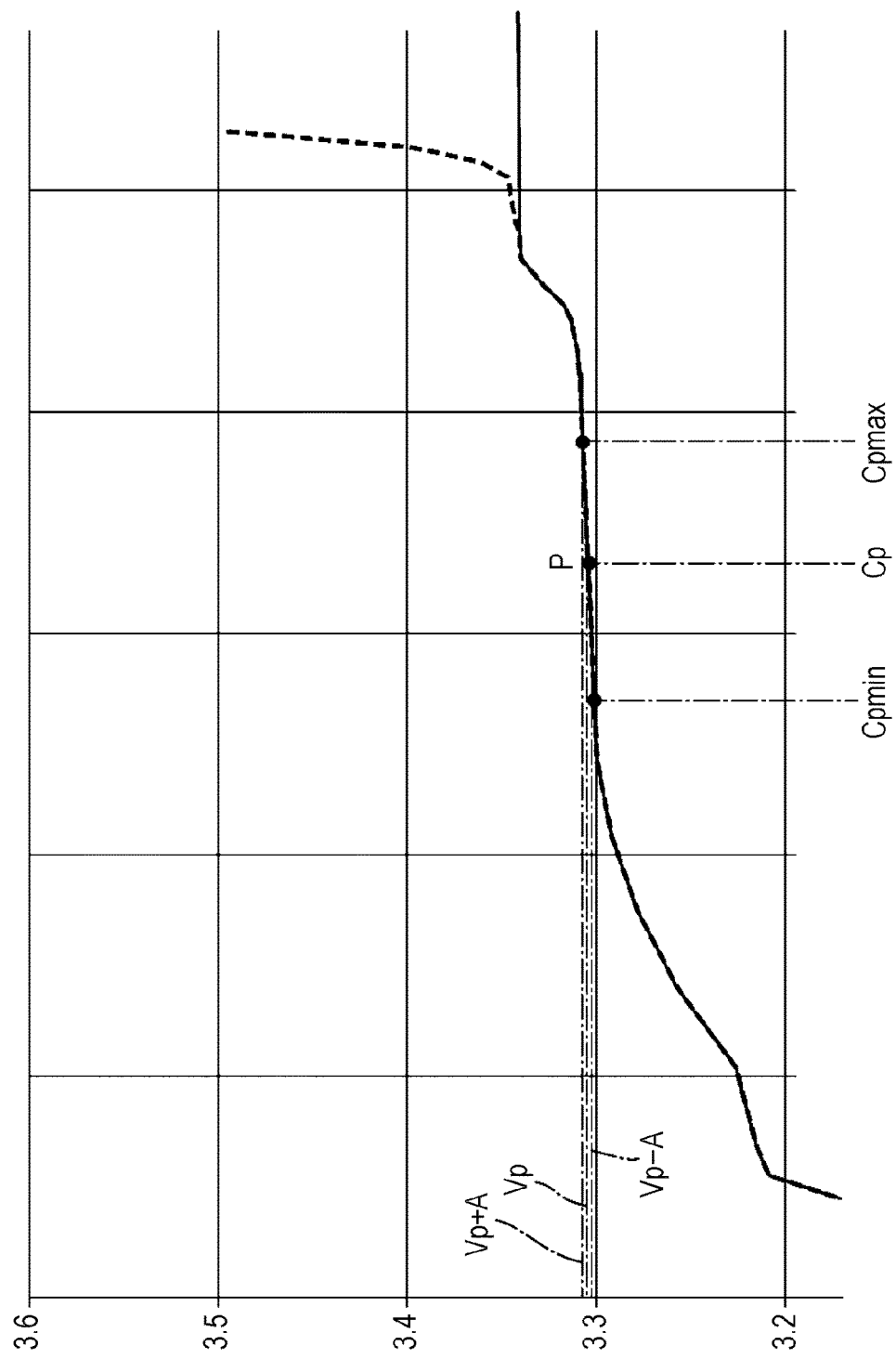
FIG. 5 is a chart enlarging a part of FIG. 4.

As shown in FIG. 5, the minimum value Cpmin and the maximum value Cpmax of the residual capacity Cp may be calculated using the C-V correlation characteristic based on the residual capacity Cp corresponding to the open voltage Vp. For example, if an error of a voltage value detected by the voltage detection circuit 80 is ±A [V], the residual capacity C corresponding to an open voltage (Vp+A) obtained by adding an error A to the open voltage Vp may be taken as the maximum value Cpmax, and the residual capacity C corresponding to an open voltage (Vp−A) obtained by subtracting the error A from the open voltage Vp may be taken as the minimum value Cpmin.

Next, a sequence for calculating the possible range for the full-charge capacity Co will be described with reference to FIG. 6.

Figure 6:
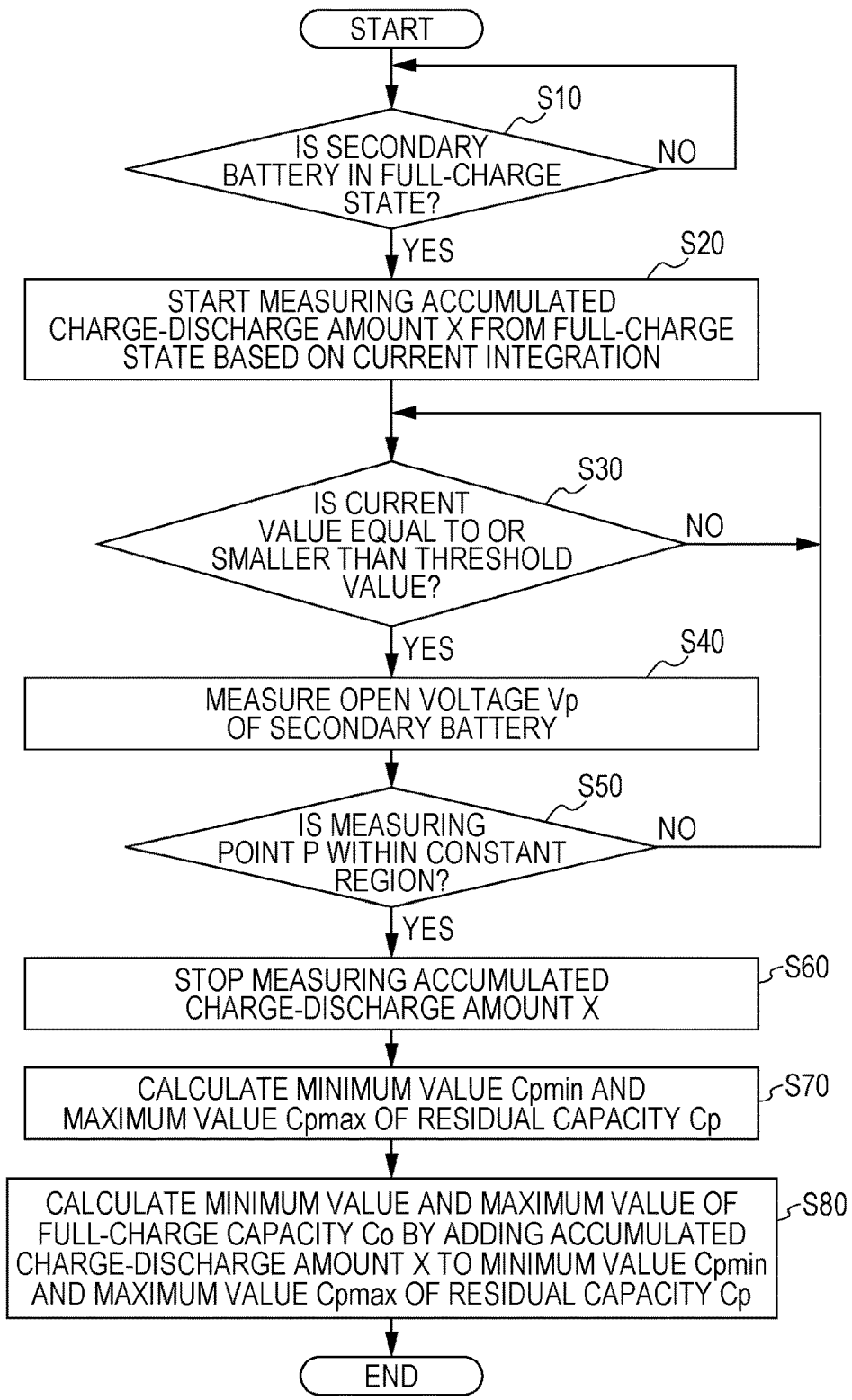
FIG. 6 is a flowchart showing a sequence for calculating a possible range for a full-charge capacity Co.

The sequence for calculating the possible range (from Comin to Comax) for the full-charge capacity Co shown in FIG. 6 includes steps S10 to S80, which are executed periodically after starting monitoring the assembled battery 30, for example.

Upon starting of the sequence, the controller 60 performs a process of determining whether or not the secondary battery 31 is in a full-charge state (S10). The controller 60 is able to determine whether or not the secondary battery 31 is in the full-charge state by detecting an operating condition of the battery charger 10 through communication. Specifically, the full-charge state of the secondary battery 31 may be detected by reception of a full-charge completion notice, which notifies the completion of charging the secondary battery 31, from the battery charger 10. Alternatively, the full-charge state may be detected by detecting the open voltage V of the secondary battery 31. If the secondary battery 31 is not in the full-charge state, the process of S10 is repeatedly performed to wait until the secondary battery 31 is brought into the full-charge state.

If the secondary battery 31 is charged by the battery charger 10 and is brought into the full-charge state, the full-charge completion notice is sent from the battery charger 10 to the controller 60. With this, the controller 60 determines that the secondary battery 31 is brought into the full-charge state (S10: YES), the controller 60 performs a process of integrating a current value measured by the current sensor 40, and measuring the accumulated charge-discharge amount X from the full-charge state (S20). Specifically, the process of integrating a current value measured by the current sensor 40 taking discharge as plus and charge as minus. The charge-discharge amount X of the secondary battery 31 is measured and accumulated as the assembled battery 30 is used (discharged or charged) from the full-charge state.

Then, as a next process, the controller 60 compares the current value of the secondary battery 31 with a first threshold value (for example, a value at which the current is substantially assumed to be zero) (S30). If a state in which the current value is smaller than the first threshold value, that is, the current is assumed to be substantially zero in this example, continues for a certain period of time, the controller 60 performs a process of measuring the open voltage V of the secondary battery 31 (S40). In this example, the process of measuring the open voltage V is performed for one representative secondary battery 31 in the plurality of the secondary batteries 31 constituting the assembled battery 30. It should be noted that a time period until the voltage becomes stable after completion of charging varies depending on temperature. Therefore, it is preferable to adjust a time period for waiting for stabilization (the certain period of time described above) depending on the temperature.

Thereafter, the controller 60 determines whether or not the measuring point P of the open voltage V is included in the constant region F1 of the secondary battery 31. In the example shown in FIG. 4, the open voltage V at a boundary point Z between the constant region F1 and the shift region F2 is 3.34 [V].

If the open voltage V of the secondary battery 31 is equal to or higher than 3.34 [V], it is determined that the measuring point P of the open voltage V is included in the shift region F2 (S50: NO). On the other hand, if the open voltage V of the secondary battery 31 is lower than 3.34 [V], it is determined that the measuring point P of the open voltage V is included in the constant region F1.

The residual capacity C is kept decreasing if the battery remains in a use state without charging after detection of the full-charge state, and eventually the state of the secondary battery 31 shifts to the constant region F1. Then, if the current value of the secondary battery 31 is substantially assumed to be zero after the state of the secondary battery 31 has completely shifted to the constant region F1, the open voltage V of the secondary battery 31 becomes lower than 3.34 [V]. Thus, upon execution of S50, the controller 60 determines that the measuring point P of the open voltage V of the secondary battery 31 is within the constant region F1.

Then, when it is determined that the measuring point P is within the constant region F1, the controller 60 terminates integration of the current value measured by the current sensor 40 (S60). With this, the accumulated charge-discharge amount X from the full-charge state to the measuring point P is obtained.

Next, the controller 60 calculates the residual capacity Cp of the secondary battery 31 at the measuring point P within the constant region F1 based on the open voltage Vp at the measuring point P and the C-V correlation characteristic. Specifically, the controller 60 first calculates the residual capacity Cp of the secondary battery 31 at the measuring point P referring to the C-V correlation characteristic stored in the memory 63 for the open voltage Vp at the measuring point P, and then calculates the minimum value Cpmin and the maximum value Cpmax of the residual capacity Cp (S70).

Specifically, if an error of a voltage value detected by the voltage detection circuit 80 is ±A [V], the residual capacity C corresponding to an open voltage (Vp+A) obtained by adding an error A to the open voltage Vp is taken as the maximum value Cpmax, and the residual capacity C corresponding to an open voltage (Vp−A) obtained by subtracting the error A from the open voltage Vp is taken as the minimum value Cpmin (see FIG. 5).

Next, the controller 60 performs a process of calculating the minimum value Comin and the maximum value Comax of the full-charge capacity Co (S80). Specifically, the minimum value Comin of the full-charge capacity Co is obtained by adding the accumulated charge-discharge amount X from the full-charge state to the measuring point P to the minimum value Cpmin of the residual capacity Cp at the measuring point P (Expression (1) below). Further, the maximum value Comax of the full-charge capacity Co is obtained by adding the accumulated charge-discharge amount X from the full-charge state to the measuring point P to the maximum value Cpmax of the residual capacity Cp at the measuring point P (Expression (2) below).

$$\text{Comin} = \text{Cpmin} + X \quad (1)$$

$$\text{Comax} = \text{Cpmax} + X \quad (2)$$

In this manner, it is possible to calculate the possible range (from Comin to Comax) of the full-charge capacity Co of the secondary battery 31. Because the measuring point P for calculating Cpmin and Cpmax is set in the constant region F1, the calculation accuracy can be kept for calculating the possible range (from Comin to Comax) of the full-charge capacity Co regardless of the time passage from the initial state.

In Embodiment 1, lithium ion batteries are adopted in which lithium iron phosphate is used for a positive electrode and graphite is used for a negative electrode. Lithium ion batteries other than the above may be used. Any type (any combination of a positive electrode and a negative electrode) may be used and an aspect of the present invention is applicable, as long as a change in C-V correlation characteristics between a residual capacity C and an open voltage V with respect to hours of use of a battery is small (smaller correlation characteristics time change). Alternatively, if the correlation characteristics time change may be expressed by a function of time, it is possible to correct by the function, and thus an aspect of the present invention may also be applicable to C-V correlation characteristics that is predictable.

Figure 8:
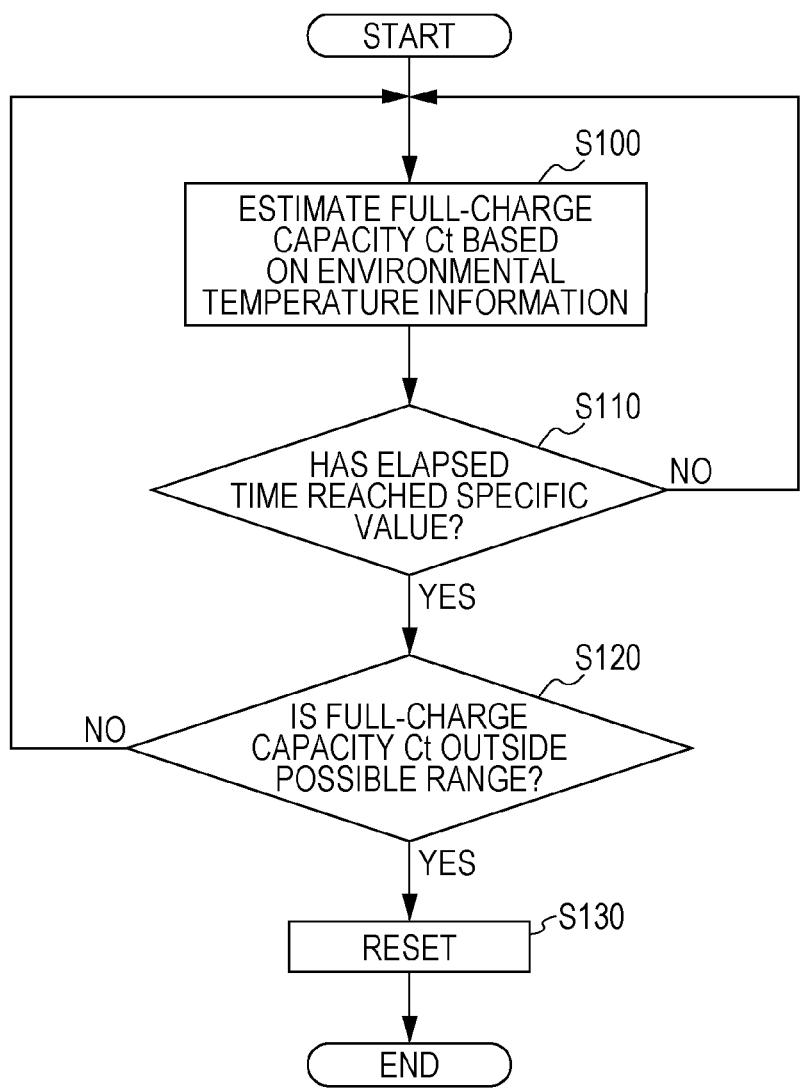
FIG. 8 is a flowchart showing a process for resetting a full-charge capacity Ct based on a record of environmental temperature.

4. Process of Estimating and Resetting Full-Charge Capacity Ct (4-1) Estimation of Full-Charge Capacity Ct based on Record of Environmental Temperature It is known that the reduced amount W of the full-charge capacity Ct of the secondary battery 31 depends on a record of temperature of the assembled battery 30. Thus, the controller 60 of the BM 50 calculates the reduced amount W of the full-charge capacity Ct of the secondary battery 31 based on environmental temperature information of the assembled battery 30 (FIG. 8, S100).

Specifically, as shown in FIG. 7, the memory 63 stores data of the reduced amount W of the full-charge capacity Ct for the environmental temperature T of the assembled battery 30 at each temperature. The reduced amount W is stored as a function taking the environmental temperature T and the elapsed time n as variables, as the reduced amount W also depends on the elapsed time n under environmental temperature.

For example, if the environmental temperature of the assembled battery is "T1" and the elapsed time is "n1", the reduced amount W of the full-charge capacity Ct is W(T1, n1). Further, if the environmental temperature of the assembled battery is "T2" and the elapsed time is "n2", the reduced amount W of the full-charge capacity Ct is W(T2, n2).

After starting using the secondary battery 31, the controller 60 continuously obtains data for the environmental temperature T and the elapsed time n of the assembled battery 30. Then, the controller 60 performs a process of calculating the reduced amount W of the full-charge capacity Ct at a certain frequency. Further, the controller 60 calculates the full-charge capacity Ct of the secondary battery 31 by subtracting the reduced amount W that has been calculated from an initial value Cos of the full-charge capacity Ct, and updates and stores the data in the memory 63. In this manner, the BM 50 updates and maintains latest data (estimated value) of the full-charge capacity Ct based on the record of environmental temperature.

$$Ct = \text{Cos} - W \quad (3)$$

(4-2) Resetting Full-Charge Capacity Ct

FIG. 8 is a flowchart showing a process for resetting the full-charge capacity Ct based on the record of environmental temperature. In the method of estimating the full-charge capacity Ct based on the record of environmental temperature, errors in temperature measurement by the temperature sensor 95 are accumulated, and an amount of the errors increases if elapsed time after stating the estimation becomes long.

Thus, the controller 60 performs a process of comparing the elapsed time after stating the estimation of the full-charge capacity Ct with a specific value (S110). Then, if the elapsed time after stating the estimation is over the specific value, the controller 60 performs a process of comparing the estimated value of the full-charge capacity Ct based on the record of environmental temperature with the possible range (from Comin to Comax) for the full-charge capacity Co (S120). Thereafter, if the estimated value of the full-charge capacity Ct based on the record of environmental temperature is outside the possible range (from Comin to Comax), the controller 60 resets the estimated value of the full-charge capacity Ct based on the record of environmental temperature to a value within the possible range (from Comin to Comax) (S130).

After the resetting, the controller 60 performs a process of estimating the full-charge capacity Ct based on the record of environmental temperature taking the reset value as an initial value. When the elapsed time after starting the estimate exceeds the specific value, the controller 60 performs a process of comparing the estimated value of the full-charge capacity Ct based on the record of environmental temperature with the possible range (from Comin to Comax) for the full-charge capacity Co.

Then, if the estimated value of the full-charge capacity Ct based on the record of environmental temperature is outside the possible range (from Comin to Comax), the controller 60 resets the estimated value of the full-charge capacity Ct again to a value within the possible range (from Comin to Comax).

Figure 9:
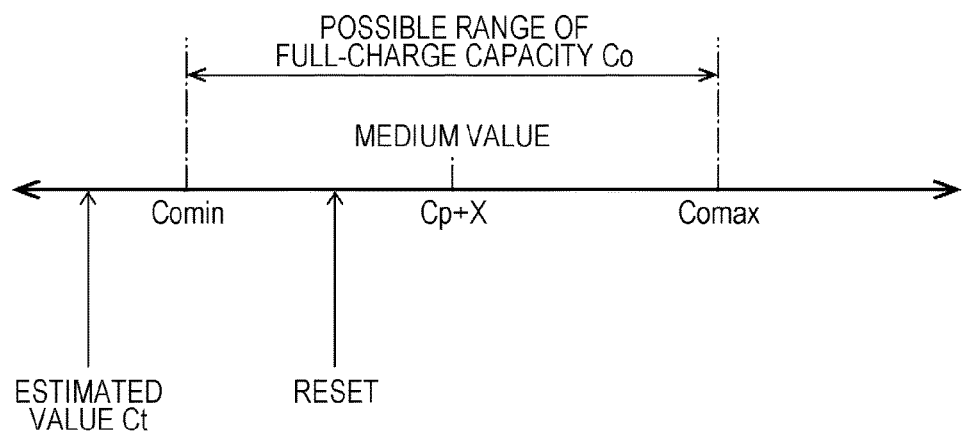
FIG. 9 is a diagram showing a possible range for a full-charge capacity by a number line.

Here, the resetting of the estimated value may be performed in a half of the possible range (from Comin to Comax) on a side closer to the compared estimated value. For example, as shown in FIG. 9, if the estimated value of the full-charge capacity Ct is outside a lower side of the range, it is preferable that the estimated value is reset (overwritten) to a value in a range from a medium value (Cp+X) of the possible range to the minimum value (Comin). In this manner, it is possible to reset the estimated value of the full-charge capacity Ct based on the record of environmental temperature to a value closer to a true value.

5. Effect

According to the BM 50 of Embodiment 1, it is possible to calculate the possible range (from Comin to Comax) for the full-charge capacity Co. Further, the estimated value of the full-charge capacity Ct based on the record of environmental temperature is compared with the possible range (from Comin to Comax) for the full-charge capacity Co, and reset to a value within the possible range (from Comin to Comax) if the estimated value is outside the possible range. Therefore, it is possible to reduce accumulation of errors in temperature measurement by the temperature sensor 95 when the full-charge capacity Ct is estimated.

<Embodiment 2>

Figure 12:
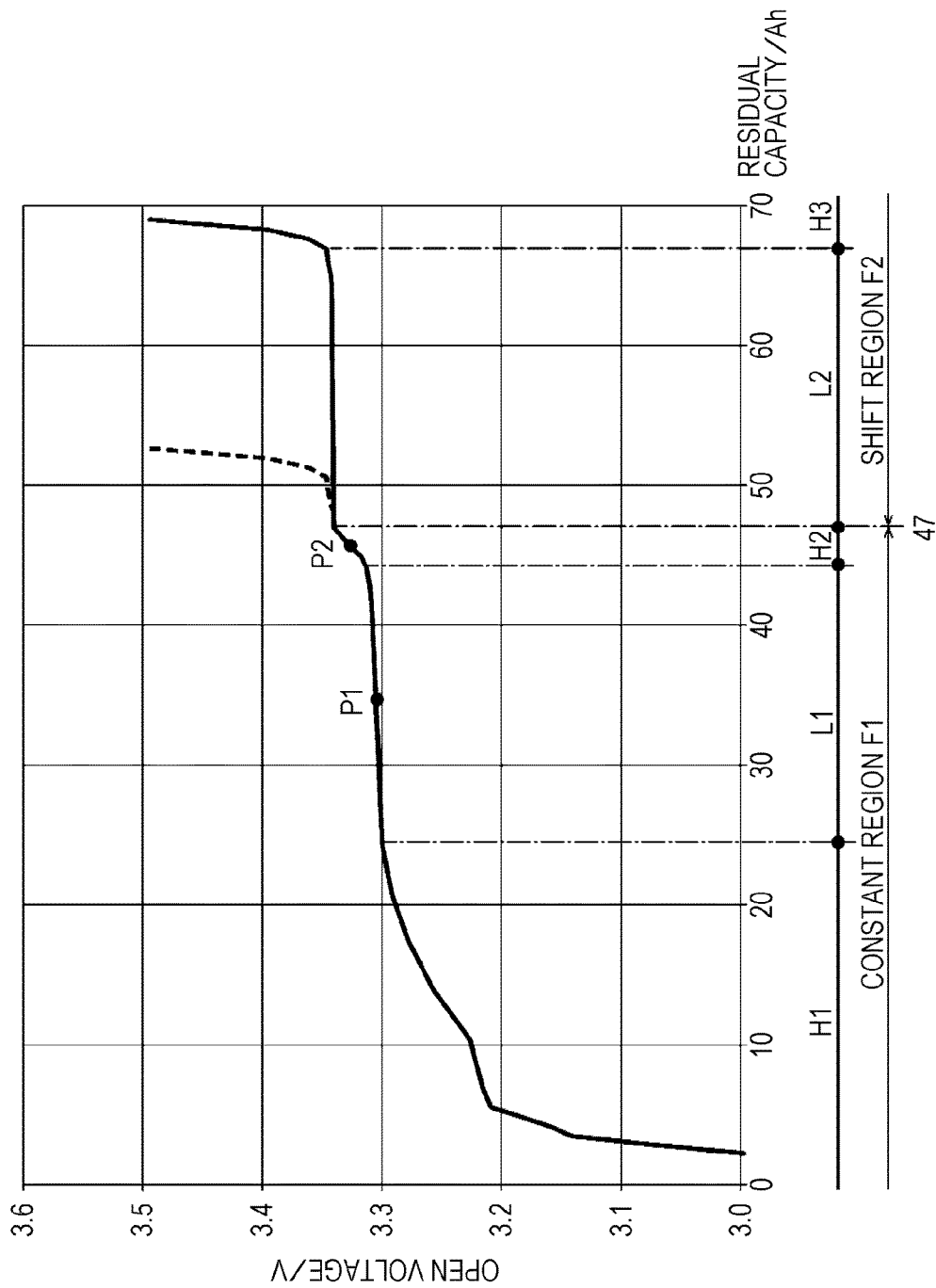
FIG. 12 is a chart showing C-V correlation characteristics of a secondary battery in Embodiment 2.
Figure 13:
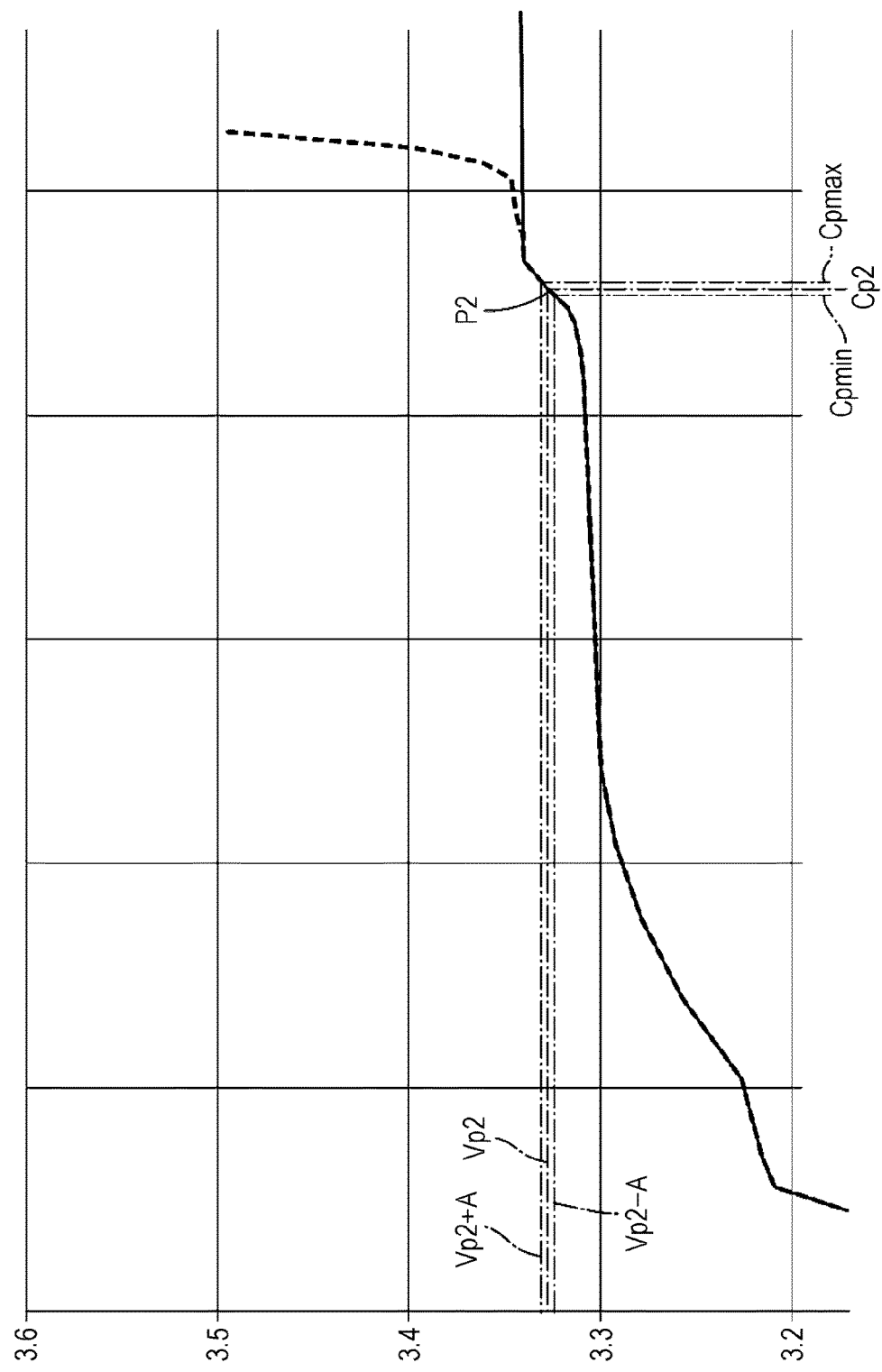
FIG. 13 is a chart enlarging a part of FIG. 11.

Next, Embodiment 2 of the present invention will be described with reference to FIG. 12 and FIG. 13. Similarly to the battery pack 20 according to Embodiment 1, the battery pack 20 according to Embodiment 2 includes the assembled battery 30, the current sensor 40, and the battery manager 50 that manages the assembled battery 30.

In Embodiment 1, the open voltage Vp is measured at one measuring point P within the constant region F1 when the possible range (from Comin to Comax) for the full-charge capacity Co is calculated by the controller 60. In Embodiment 2, when the possible range (from Comin to Comax) for the full-charge capacity Co is calculated by the controller 60, the open voltage Vp is measured at two measuring points P within the constant region F1. Then, a process of determining whether or not a ratio of change of the open voltage V with respect to the residual capacity C is different between the two measuring points P is performed.

In this example, the first low-change region L1, the first high-change region H1, and the second high-change region H2 are included in the constant region F1. Therefore, as shown in FIG. 12, when the measuring point P1 is included in the low-change region L1 and the measuring point P2 is included in either the first high-change region H1 or the second high-change region H2, it is determined that the ratio of change of the open voltage V with respect to the residual capacity C is different between the two measuring points P1, P2.

If the ratio of change of the open voltage V with respect to the residual capacity C is different between the two measuring points P1, P2, one of the measuring points P whose ratio of change of the open voltage V is higher is selected, and a process of calculating the minimum value Comin and the maximum value Comax of the full-charge capacity Co of the energy storage device is performed. For example, in the example shown in FIG. 12, a possible range of the possible range (from Comin to Comax) for the full-charge capacity Co is calculated based on the measuring point P2 included in the second high-change region H2.

Specifically, the controller 60 calculates the residual capacity Cp2 of the secondary battery 31 at the measuring point P2 referring to the C-V correlation characteristic stored in the memory 63 for the open voltage Vp2 at the measuring point P2. Further, the controller 60 calculates the minimum value Cpmin and the maximum value Cpmax of the residual capacity Cp2 by adding a capacity corresponding to an error ±A of the voltage value detected by the voltage detection circuit 80 (see FIG. 13).

Then, the minimum value Comin of the full-charge capacity Co is obtained by adding the accumulated charge-discharge amount X from the full-charge state to the measuring point P2 to the minimum value Cpmin of the residual capacity Cp2 at the measuring point P2. Further, the maximum value Comax of the full-charge capacity Co is obtained by adding the accumulated charge-discharge amount X from the full-charge state to the measuring point P to the maximum value Cpmax of the residual capacity Cp1 at the measuring point P2.

In this manner, the possible range (from Comin to Comax) for the full-charge capacity Co may be narrowed, that is, restricted to a small range as compared to the case in which the measuring point P1 whose ratio of change of the open voltage V is smaller. Therefore, it is possible to reset the estimated value of the full-charge capacity Ct based on the record of environmental temperature to a value further closer to a true value.

<Embodiment 3>

Next, Embodiment 3 of the present invention will be described. Similarly to the battery pack 20 according to Embodiment 1, the battery pack 20 according to Embodiment 3 includes the assembled battery 30, the current sensor 40, and the battery manager 50 that manages the assembled battery 30. Embodiment 3 is different from Embodiment 1 in the method of calculating the minimum value Comin and the maximum value Comax of the full-charge capacity Co.

In Embodiment 1, the controller 60 calculates the minimum value Comin of the full-charge capacity Co based on Expression (1), and the maximum value Comax based on Expression (2). In Embodiment 3, the controller 60 calculates the minimum value Comin of the full-charge capacity Co based on Expression (4), and the maximum value Comax of the full-charge capacity Co based on Expression (5).

$$\text{Comin} = \text{Cpmin} + X - \alpha - \beta \quad (4)$$

$$\text{Comax} = \text{Cpmax} + X + \alpha + \beta \quad (5)$$

Here, "$\alpha$" is an error of the accumulated charge-discharge amount X, and "$\beta$" is a detection error of the full-charge state.

In Embodiment 3, Expression (4) and Expression (5) include the error $\alpha$ of the accumulated charge-discharge amount X and the detection error $\beta$ of the full-charge state, and therefore it is possible to calculate the minimum value Comin and the maximum value Comax of the full-charge capacity Co accurately.

The error of the accumulated charge-discharge amount X is an error of current integration, that is, accumulation of measurement errors by the current sensor 40. The detection error of the full-charge state is an error that occurs due to detection shift at timing when the charge current falls under the first threshold value.

<Embodiment 4>

Figure 14:
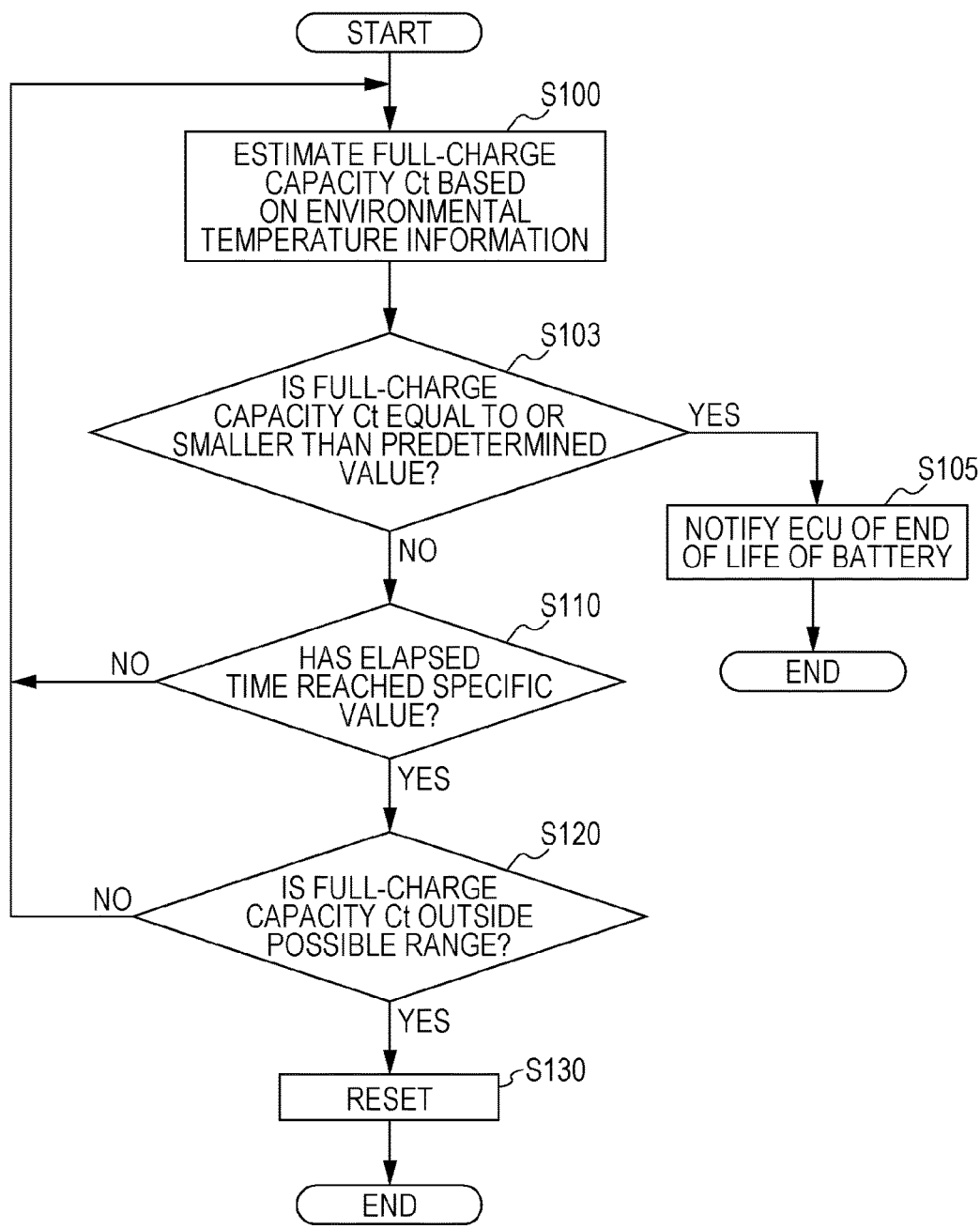
FIG. 14 is a flowchart showing a process for resetting a full-charge capacity Ct based on a record of environmental temperature in Embodiment 4.

Next, Embodiment 4 of the present invention will be described with reference to FIG. 14. Similarly to the battery pack 20 according to Embodiment 1, the battery pack 20 according to Embodiment 4 includes the assembled battery 30, the current sensor 40, and the BM 50. In Embodiment 1, the full-charge capacity Ct of the secondary battery 31 is calculated based on data of the environmental temperature T and the elapsed time n. In Embodiment 4, a process of determining life of the assembled battery 30 based on the full-charge capacity Ct is added.

Specifically, in Embodiment 4, two steps of S103 and S105 are added to the process of resetting the full-charge capacity Ct based on the record of environmental temperature described with reference to FIG. 8 in Embodiment 1. In S103, the controller 60 performs a process of comparing the full-charge capacity Ct of the secondary battery 31 calculated based on the environmental temperature information with a predetermined value (a battery capacity at an end of life). Then, if the full-charge capacity Ct is lower than the predetermined value, the controller 60 determines that it is an end of life of the assembled battery 30, and notifies the ECU 100 of the end of life of the assembled battery 30. Then, upon reception of "the notification on the end of life of the assembled battery 30", the ECU 100 gives the user a warning to encourage exchanging of the battery. In this manner, the user may be encouraged to exchange the battery, and it is possible to prevent a battery from being used after its life has ended.

If the full-charge capacity Ct is higher than the predetermined value (the battery is not at the end of life), the process in and after S110 is performed in the same manner as in Embodiment 1. The controller 60 is one example of a "determination unit" in the present invention.

<Embodiment 5>

Next, Embodiment 5 of the present invention will be described. Similarly to the battery pack 20 according to Embodiment 1, the battery pack 20 according to Embodiment 5 includes the assembled battery 30, the current sensor 40, and the battery manager 50 that manages the assembled battery 30. In Embodiment 1, the possible range (from Comin to Comax) for the full-charge capacity Co is calculated by the controller 60. In Embodiment 5, the controller 60 calculates the full-charge capacity Co based on the open voltage Vp at an arbitrary measuring point P within the constant region F1 and the accumulated charge-discharge amount X from the full-charge state to the measuring point P. Specifically, the full-charge capacity Co is calculated based on Expression (6) below.

$$Co = Cp + X \quad (6)$$

Here, "Cp" is the residual capacity at an arbitrary measuring point P within the constant region F1, and "X" is the accumulated charge-discharge amount from the full-charge state to the measuring point P.

In Embodiment 5, an estimation accuracy for estimating a full-charge capacity Co can be kept regardless of time passage from the initial state. Further, the full-charge capacity Co of the secondary battery 31 may be calculated without discharging to an end-of-discharge voltage.

In the meantime, as described in Embodiment 1, the constant region F1 includes the first low-change region L1, the first high-change region H1, and the second high-change region H2. In the first low-change region L1, the ratio of change of the open voltage V with respect to the residual capacity C is small. Accordingly, when the residual capacity Cp corresponding to the measuring point P is obtained using the C-V correlation characteristic, an error of the residual capacity Cp, that is, a calculation error of the full-charge capacity Co increases due to a measurement error of the open voltage V. Therefore, when the full-charge capacity Co is calculated based on the residual capacity Cp at the measuring point P within the first low-change region L1, it is preferable to use the voltage detection circuit 80 whose voltage measurement is highly accurate.

In the first high-change region H1 and the second high-change region H2, the ratio of change of the open voltage V with respect to the residual capacity C is large even within the constant region F1, and therefore an error of the residual capacity Cp, that is, an error of the full-charge capacity Co is relatively small. Accordingly, the full-charge capacity Co may be calculated by selecting the measuring point P in the first high-change region H1 or the second high-change region H2. In this manner, it is possible to obtain the full-charge capacity Co accurately without using the voltage detection circuit 80 with high accuracy. Here, a region in which the measuring point P is included may be determined by referring the C-V correlation characteristic for the open voltage Vp at the measuring point P.

<Other Embodiments>

The present invention is not restricted to the embodiments described above. The following embodiments may also be included within the technical scope of the present invention.

(1) In Embodiment 1, the possible range (from Comin to Comax) for the full-charge capacity Co is calculated in the following order. The possible range (from Comin to Comax) for the full-charge capacity Co is calculated in the order of: "detection of the full-charge state"→"current integration (charge-discharge)"→"measurement of the open voltage Vp at the measuring point P within the constant region"→"calculation of the minimum value Cpmin and the maximum value Cpmax of the residual capacity Cp corresponding to the measuring point P"→"addition of the accumulated charge-discharge amount X.

Other than the above order, the possible range (from Comin to Comax) for the full-charge capacity Co may be calculated in the order of: "measurement of the open voltage Vp at the measuring point P within the constant region"→"calculation of the minimum value Cpmin and the maximum value Cpmax of the residual capacity Cp corresponding to the measuring point P"→"current integration (charge-discharge)"→"detection of the full-charge state"→"addition of the accumulated charge-discharge amount X", for example.

(2) Embodiment 1 shows the example in which, as the C-V correlation characteristic of the secondary battery 31, the C-V correlation characteristics are substantially identical in "the constant region F1" in which the residual capacity C is smaller than 47 [Ah], regardless of occurrence of capacity degradation due to time passage from the initial state. However, the C-V correlation characteristics are not necessary to be identical in "the constant region F1" as shown, as long as a change in the C-V correlation is relatively smaller than the other regions (the shift region F2) regardless of occurrence of capacity degradation.

(3) Embodiment 1 takes the lithium ion secondary battery 31 as one example of the energy storage device. However, the energy storage device may be other than the lithium ion battery, as long as the battery has the C-V correlation characteristic having a constant region in which, as shown in FIG. 4, a time change in the C-V correlation is relatively smaller than the other regions (shift region).

(4) Embodiment 1 shows the example in which the current sensor 40 is provided separately from the BM 50. However, the current sensor 40 may be configured to be included in the BM 50.

(5) In Embodiment 3, the expressions for calculating the minimum value Comin and the maximum value Comax of the full-charge capacity Co include the error α of the accumulated charge-discharge amount X and the detection error β of the full-charge state. However, an expression including only one of the error α and the detection error β may be used.

(6) Embodiment 1 shows the example in which in the method of calculating the accumulated charge-discharge amount X from the full-charge state to the measuring point P, the full-charge state is first detected, and then the accumulated charge-discharge amount X from the full-charge state to the measuring point P is actually measured. However, other than such a method, the accumulated charge-discharge capacity X may be calculated using a capacity difference M from the full-charge state to a near-full-charge state.

Figure 15:
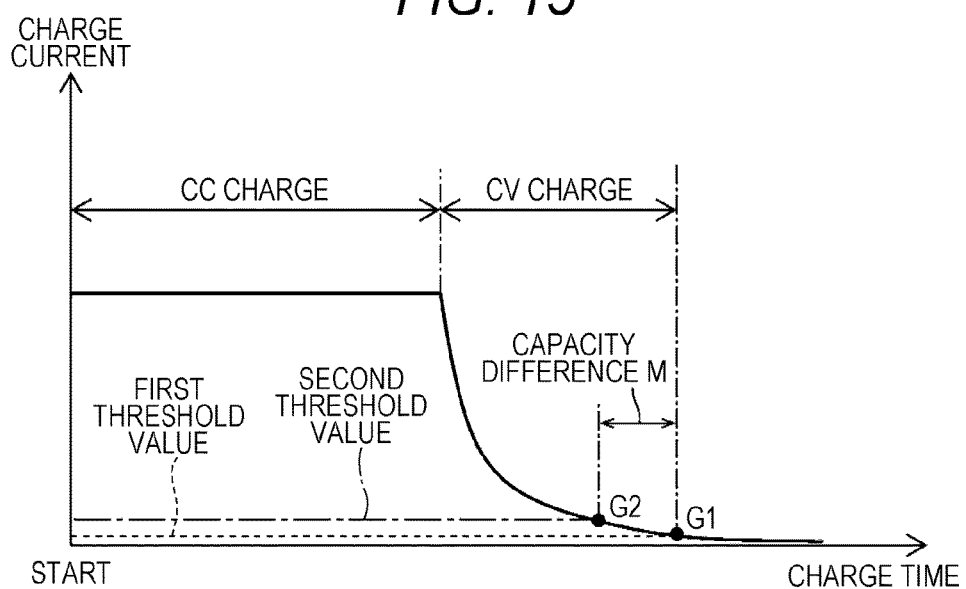
FIG. 15 is a chart showing charge characteristics of a secondary battery (showing a capacity difference M between full-charge state and near-full-charge state).

For example, as shown in FIG. 15, if the "capacity difference M" between a full-charge state (a state in which the charge current in CV charge corresponds to a first threshold value) G1 and a near-full-charge state (a state in which the charge current corresponds to a second threshold value that is higher than the first threshold value) G2 is known in advance from data such as experimental data, it is possible, by measuring an accumulated charge-discharge amount X1 from the near-full-charge state G2 to the measuring point P, to obtain the accumulated charge-discharge amount X by Expression (7) below based on the measured value X1 by the measurement and the capacity difference M.

$$X=X1+M \quad (7)$$

X: the accumulated charge-discharge amount from the full-charge state G1 to the measuring point P X1: the accumulated charge-discharge amount from the near-full-charge state G2 to the measuring point P (measured value)

M: the capacity difference between the full-charge state G1 and the near-full-charge state G2 (estimated value based on data such as experimental data)

In this manner, it is possible to obtain an advantage that the accumulated charge-discharge amount X and the possible range (from Comin to Comax) for the full-charge capacity Co may be obtained by charging to the near-full-charge state G2 that is close to the full-charge state 01, instead of charging to the full-charge state G1.

(7) In Embodiment 1, the open voltage V of the secondary battery 31 is compared with the open voltage at the boundary point Z between the constant region F1 and the shift region F2 in order to determine whether the measuring point P is included in the constant region F1.

If the C-V correlation characteristics contain a region where a time change is large (e.g., the shift region F2 in FIG. 4) and a region where a time change is small (e.g., the constant region F1 in FIG. 4), it can be determined in which region the measuring point P is included by comparing the residual capacity Cp of the secondary battery 31 with a predetermined value U. The controller 60 may perform processes of (A) to (C) described below to calculate the full-charge capacity Co. The predetermined value U may be a boundary point between the region where a time change is large and the region where a time change is small. In the example of FIG. 4, the predetermined value may be set to 47 [Ah].

(A) Measuring the open voltage Vp of the secondary battery 31 at an arbitrary measuring point Pat which the current value is equal to or lower than a first threshold value. Calculating the residual capacity Cp of the secondary battery 31 at the measuring point from the open voltage Vp by referring to the C-V correlation characteristics of the secondary battery 31.

(B) Determining whether the calculated residual capacity Cp is equal to or lower than the predetermined value U.

(C) Calculating the full-charge capacity Co of the secondary battery based on the residual capacity Cp and on the accumulated charge-discharge amount X from the full-charge state to the measuring point P. Specifically, similar to Expression (6) in Embodiment 5, the full-charge capacity Co is calculated by adding the minimum value Comin and the maximum value Comax of the full-charge capacity Co of the secondary battery 31, respectively, by adding the accumulated charge-discharge amount X to the residual capacity Cp.

With the above method, similar to Embodiment 5, an estimation accuracy of the full-charge capacity can be kept regardless of time passage from the initial state.

In the above process (C), estimation of the full-charge capacity Co is performed if the residual capacity Cp is equal to or less than the predetermined value. This is because the region where a time change is large is located on a high residual capacity side and the region where a time change is small is located on a low residual capacity side in the C-V correlation characteristics of the secondary battery 31. If the residual capacity Cp is equal to or lower than the predetermined value U, the measuring point P can be determined to be contained in the region where a time change is small. In the above process (B), if the residual capacity Cp is more than the predetermined value U, then the process (C) is performed after the residual capacity Cp becomes equal to or less than the predetermined value U.

What is claimed is:

1. A state estimation device that estimates a state of an energy storage device, the state estimation device comprising:
a voltage detection circuit configured to measure a voltage of the energy storage device;
a current integration unit configured to integrate a current that flows through the energy storage device; and
a first estimation unit configured to estimate a full-charge capacity of the energy storage device, wherein the energy storage device has a correlation characteristic of correlation between a residual capacity C and an open circuit voltage V, the correlation characteristic including a constant region in which a time change in the correlation characteristic is relatively smaller than an other region, and the first estimation unit performs:

determination of whether a measuring point P is within the constant region;

if the measuring point P is within the constant region, calculation of a residual capacity Cp of the energy storage device at the measuring point P based on an open circuit voltage Vp of the energy storage device measured by the voltage detection circuit at the measuring point P included in the constant region, and on the correlation characteristic; and estimation of a full-charge capacity Co of the energy storage device based on the residual capacity Cp at the measuring point P that has been calculated, and on an accumulated charge-discharge amount X of the energy storage device from a full-charge state to the measuring point P, the full-charge state satisfying a full charge condition.

2. The state estimation device according to claim 1, wherein the first estimation unit performs:

calculation of a minimum value Cpmin and a maximum value Cpmax of the residual capacity Cp of the energy storage device at the measuring point P based on the open circuit voltage Vp at the measuring point P and the correlation characteristic; and calculation of a minimum value Comin and a maximum value Comax of the full-charge capacity Co of the energy storage device respectively by adding the accumulated charge-discharge amount X to the minimum value Cpmin and the maximum value Cpmax of the residual capacity Cp.

3. The state estimation device according to claim 2, wherein when the open circuit voltage Vp is measured at two different measuring points P at which ratios of change of the open circuit voltage V with respect to the residual capacity C are different, the first estimation unit performs a process of calculating the minimum value Comin and the maximum value Comax of the full-charge capacity Co of the energy storage device by selecting one of the measuring points P whose ratio of change of the open circuit voltage V is greater than the other.

4. The state estimation device according to claim 2, comprising:

a second estimation unit configured to estimate a full-charge capacity Ct of the energy storage device based on environmental temperature information; and a comparator unit configured to compare the full-charge capacity Ct of the energy storage device estimated based on the environmental temperature information with the minimum value Comin and the maximum value Comax of the full-charge capacity Co calculated using the correlation characteristic, wherein if the full-charge capacity Ct based on the environmental temperature information is outside a range from the minimum value Comin to the maximum value Comax, the full-charge capacity Ct based on the environmental temperature information is reset to a value within the range from the minimum value Comin to the maximum value Comax, the value being closer to the full-charge capacity Ct relative to a medium value of the range from the minimum value Comin to the maximum value Comax.

5. The state estimation device according to claim 4, comprising:

a determination unit configured to determine life of the energy storage device by comparing the full-charge capacity Ct of the energy storage device estimated by the second estimation unit with a predetermined value.

6. The state estimation device according to claim 1, wherein the first estimation unit further performs:

calculation of a minimum value Cpmin and a maximum value Cpmax of the residual capacity Cp of the energy storage device at the measuring point P based on the open circuit voltage Vp at the measuring point P and the correlation characteristic.

7. The state estimation device according to claim 6, wherein the first estimation unit further performs:

calculation of a minimum value Comin and a maximum value Comax of the full-charge capacity Co of the energy storage device respectively based on the minimum value Cpmin and the maximum value Cpmax of the residual capacity Cp.

8. The state estimation device according to claim 1, further comprising:

a controller including the current integration unit and the first estimation unit.

9. The state estimation device according to claim 8, wherein the controller comprises a memory which stores:

a calculation program for calculating a possible range of the full-charge capacity Co of the energy storage device; and data for executing the calculation program, including data of residual capacity-open voltage (C-V) correlation characteristics for the energy storage device.

10. The state estimation device according to claim 9, wherein the controller further comprises a central processing unit (CPU) which executes the calculation program.

11. The state estimation device according to claim 8, wherein the controller further comprises a counter for counting an elapsed time.

12. The state estimation device according to claim 8, wherein the state estimation device is included in a vehicle, and the controller further comprises a communication unit which is communicatively coupled to an electronic control unit (ECU) of the vehicle.

13. A battery pack comprising:

the state estimation device according to claim 8; and a current sensor which measures a current value of the energy storage device, and transmits the measured current value to the controller.

14. The state estimation device according to claim 8, further comprising:

a temperature sensor which measures a temperature of the energy storage device, and transmits temperature information to the controller, wherein the controller estimates a full-charge capacity Ct of the energy storage device based on the temperature information.

15. A state estimation method of estimating a state of an energy storage device having a correlation characteristic of correlation between a residual capacity C and an open circuit voltage V, the correlation characteristic including a constant region in which a time change in the correlation characteristic is relatively smaller than an other region, the method comprising:

determining whether a measuring point P is within the constant region;

if the measuring point P is within the constant region, calculating a residual capacity Cp of the energy storage device at the measuring point P based on an open circuit voltage Vp of the energy storage device at the measuring point P included in the constant region, and on the correlation characteristic; and estimating a full-charge capacity Co of the energy storage device based on the residual capacity Cp at the measuring point P that has been calculated, and on an accumulated charge-discharge amount X of the energy storage device between the measuring point P and a full-charge state satisfying a full charge condition.

16. The state estimation method according to claim 15, wherein in the calculating, a minimum value Cpmin and a maximum value Cpmax of the residual capacity Cp of the energy storage device at the measuring point P are calculated based on the open circuit voltage Vp at the measuring point P and the correlation characteristic, and in the estimating, a minimum value Comin and a maximum value Comax of the full-charge capacity Co of the energy storage device are respectively calculated by adding the accumulated charge-discharge amount X to the minimum value Cpmin and the maximum value Cpmax of the residual capacity Cp.

17. The state estimation method according to claim 15, wherein when the open circuit voltage Vp is measured at two different measuring points P at which ratios of change of the open circuit voltage V with respect to the residual capacity C are different, the calculating and the estimating are performed by selecting one of the measuring points P whose ratio of change of the open circuit voltage V is greater than the other.

18. The state estimation method according to claim 15, further comprising:

measuring a voltage of the energy storage device using a voltage detection circuit, wherein the open circuit voltage Vp of the energy storage device is measured by the voltage detection circuit.

19. A state estimation device that estimates a state of an energy storage device, the state estimation device comprising:

a voltage detection circuit configured to measure a voltage of the energy storage device;

a current integration unit configured to integrate a current that flows through the energy storage device; and a first estimation unit configured to estimate a full-charge capacity of the energy storage device, wherein the first estimation unit performs:

determination of whether an arbitrary measuring point P is within a constant region of a correlation characteristic of correlation between a residual capacity C and an open circuit voltage V, the constant region being a region in which a time change in the correlation characteristic is relatively smaller than an other region;

if the arbitrary measuring point P is within the constant region, calculation of a residual capacity Cp of the energy storage device at the arbitrary measuring point P based on an open circuit voltage Vp of the energy storage device measured by the voltage detection circuit at the measuring point P, and on a correlation characteristic between a residual capacity C and the open circuit voltage Vp;

confirmation that the residual capacity Cp that has been calculated is equal to or lower than a predetermined value; and estimation of a full-charge capacity Co of the energy storage device based on the residual capacity Cp at the measuring point P, and on an accumulated charge-discharge amount X of the energy storage device from a full-charge state to the measuring point P, the full-charge state satisfying a full charge condition.

20. A state estimation method of estimating a state of an energy storage device, the method comprising:

determining whether an arbitrary measuring point P is within a constant region of a correlation characteristic of correlation between a residual capacity C and an open circuit voltage V, the constant region being a region in which a time change in the correlation characteristic is relatively smaller than an other region;

if the arbitrary measuring point P is within the constant region, calculating a residual capacity Cp of the energy storage device at the arbitrary measuring point P based on an open circuit voltage Vp of the energy storage device at the measuring point P, and on a correlation characteristic between a residual capacity C and the open circuit voltage Vp;

confirming that the residual capacity Cp that has been calculated is equal to or lower than a predetermined value; and estimating a full-charge capacity Co of the energy storage device based on the residual capacity Cp at the measuring point P, and on an accumulated charge-discharge amount X of the energy storage device from the measuring point P to a full-charge state satisfying a full charge condition.

* * * * *